US010115826B2

(12) United States Patent
Lee et al.

(10) Patent No.: US 10,115,826 B2
(45) Date of Patent: Oct. 30, 2018

(54) SEMICONDUCTOR STRUCTURE AND THE MANUFACTURING METHOD THEREOF

(71) Applicant: TAIWAN SEMICONDUCTOR MANUFACTURING COMPANY LTD., Hsinchu (TW)

(72) Inventors: Yi-Jing Lee, Hsinchu (TW); Cheng-Hsien Wu, Hsinchu (TW); Chih-Hsin Ko, Kaohsiung County (TW); Clement Hsingjen Wann, Carmel, NY (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/370,841

(22) Filed: Dec. 6, 2016

(65) Prior Publication Data
US 2017/0084746 A1    Mar. 23, 2017

Related U.S. Application Data

(62) Division of application No. 14/026,067, filed on Sep. 13, 2013, now Pat. No. 9,553,012.

(51) Int. Cl.
*H01L 29/78* (2006.01)
*H01L 21/762* (2006.01)
(Continued)

(52) U.S. Cl.
CPC ...... *H01L 29/7849* (2013.01); *H01L 21/7624* (2013.01); *H01L 21/76283* (2013.01);
(Continued)

(58) Field of Classification Search
CPC . H01L 29/7849; H01L 29/0649; H01L 29/16; H01L 29/66795; H01L 29/785;
(Continued)

(56) References Cited

U.S. PATENT DOCUMENTS

| 5,963,817 | A | * | 10/1999 | Chu | ............ | H01L 21/76264 |
| | | | | | | 257/E21.564 |
| 7,425,740 | B2 | | 9/2008 | Liu et al. | | |
| 8,048,723 | B2 | | 11/2011 | Chang et al. | | |
| 8,053,299 | B2 | | 11/2011 | Xu | | |
| 8,183,627 | B2 | | 5/2012 | Currie | | |
| 8,415,718 | B2 | | 4/2013 | Xu | | |

(Continued)

*Primary Examiner* — Cheung Lee
*Assistant Examiner* — Stephen C Smith
(74) *Attorney, Agent, or Firm* — WPAT, P.C., Intellectual Property Attorneys; Anthony King

(57) ABSTRACT

The present disclosure provides a FinFET. The FinFET includes a silicon-on-insulator (SOI) with an insulator; a plurality of fin structures on the insulator; an isolation on the insulator, and between two adjacent fin structures in the plurality of fin structures; and an oxide layer between each of the plurality of fin structures and the insulator, wherein the insulator comprises silicon germanium oxide. A method for manufacturing the FinFET includes forming a plurality of fin structures on a layer having a larger lattice constant than that of the fin structure by a patterning operation; oxidizing the fin structure and the layer to transform the layer into a first oxide layer; filling insulating material between adjacent fin structures; and etching the insulating material to expose a top surface and at least a portion of a sidewall of the fin structure.

20 Claims, 11 Drawing Sheets

(51) Int. Cl.
  *H01L 29/06* (2006.01)
  *H01L 29/66* (2006.01)
  *H01L 29/16* (2006.01)
  *H01L 21/02* (2006.01)
  *H01L 21/3065* (2006.01)
  *H01L 21/311* (2006.01)

(52) U.S. Cl.
  CPC .......... *H01L 29/0649* (2013.01); *H01L 29/16* (2013.01); *H01L 29/66795* (2013.01); *H01L 29/785* (2013.01); *H01L 21/02129* (2013.01); *H01L 21/02164* (2013.01); *H01L 21/02236* (2013.01); *H01L 21/02238* (2013.01); *H01L 21/02255* (2013.01); *H01L 21/02263* (2013.01); *H01L 21/02274* (2013.01); *H01L 21/3065* (2013.01); *H01L 21/31116* (2013.01)

(58) Field of Classification Search
  CPC .......... H01L 21/7624; H01L 21/76283; H01L 21/02129; H01L 21/02164; H01L 21/02236; H01L 21/02238; H01L 21/02255; H01L 21/02263; H01L 21/02274; H01L 21/3065; H01L 21/31116
  See application file for complete search history.

(56) References Cited

U.S. PATENT DOCUMENTS

| | | |
|---|---|---|
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 2003/0013323 A1* | 1/2003 | Hammond ...... H01L 21/823807 438/770 |
| 2011/0081764 A1* | 4/2011 | Maszara ............... H01L 29/785 438/413 |
| 2013/0285153 A1 | 10/2013 | Lee et al. |
| 2014/0183600 A1 | 7/2014 | Huang et al. |
| 2014/0264590 A1 | 9/2014 | Yu et al. |
| 2014/0264592 A1 | 9/2014 | Oxland et al. |
| 2014/0285980 A1* | 9/2014 | Cappellani ............. H01L 21/76 361/748 |
| 2015/0263003 A1 | 9/2015 | Lee et al. |

* cited by examiner

SEMICONDUCTOR STRUCTURE AND THE MANUFACTURING METHOD THEREOF

CROSS REFERENCE

This application claims the benefit of prior-filed application Ser. No. 14/026,067, filed Sep. 13, 2013, under 35 U.S.C. 120.

FIELD

The present disclosure relates to a semiconductor transistor.

BACKGROUND

With the size of CMOS device being continuously scaled down, the influences of the short channel effect and the charge carrier mobility deterioration effect in the device are increasingly serious. With respect to the development of the silicon based CMOS technology, the requirements for the ability of suppressing the short channel effect and the ability of improving the charge carrier mobility in the device become more and more urgent.

When the feature size of a device enters into sub-100 nm regime, the short channel effect of the device is deteriorated, so that the method for obtaining better performance by further reducing the size of the device becomes extremely difficult. In order to relieve the pressure resulted from the reduction of the device size, stress is introduced into a channel by adopting strained-silicon technology so as to improve the charge carrier mobility in the channel and the performance of a transistor device, which has become a method widely adopted and indispensable in the engineering of microelectronic fabrication. Its basic principle is that, stress is introduced into a channel region of a transistor by means of the device structure, material, and process design so that the lattice structure of crystals is varied, and thus leads to the variation of the charge carrier mobility. Under appropriate stress, charge carrier mobility may be improved. For example, the tensile stress in the channel direction improves the electron mobility, and the compressive stress in the channel direction improves the hole mobility.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
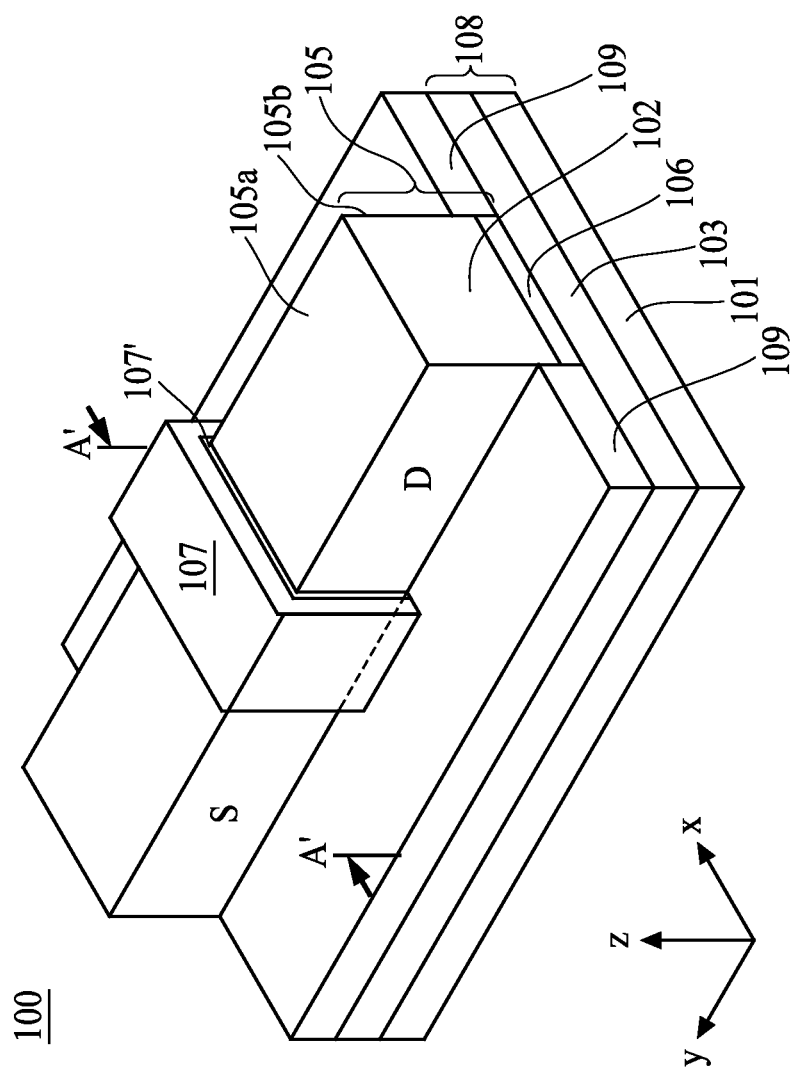
FIG. 1 is a perspective view of a FinFET structure according to some embodiments of the present disclosure.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Various methods of increasing carrier mobility by inducing a strain in the channels has been proposed to improve the operation speed and operation current of a semiconductor device. The methods include:

1) Strain is produced in the channel portion by means of Si/SiGe heterojunction structure. A graded $SiGe_x$ layer or a relaxed $SiGe_x$ layer is formed on a patterned silicon substrate, followed by a formation of a silicon layer which in turn becoming the strained silicon channel.

2) Strain is produced in the channel portion by means of Si/SiGe heterojunction structure. A graded $SiGe_x$ layer or a relaxed $SiGe_x$ layer is formed on a commercially acquired silicon-on-insulator (SOI) substrate, followed by a formation of the silicon layer which in turn becoming the strained silicon channel.

3) Strain is produced in the channel portion by means of Si/SiGe heterojunction substrate structure. By commercially acquiring a non-silicon substrate, such as a SiGe substrate, stress is applied to the channel layer by means of the lattice difference between the SiGe substrate and the surface Si channel layer. Since the lattice constant of SiGe is larger than that of Si, the lattice of the surface Si channel layer are stretched by the SiGe lattice of bottom layer in this case, so that tensile stress is introduced into the Si channel.

4) Stress is introduced into the channel portion by means of heterojunction source/drain structure, that is, the Si material of the source/drain region is replaced by a non-silicon material, and stress is induced in the channel by means of the heterojunction between the source/drain and the channel. For example, source/drain is formed of SiGe having a large lattice constant than that of Si, thus stress may be introduced into the silicon channel.

5) Stress is introduced into the channel and the substrate by covering a high stress layer over the device, that is, a high stress thin film is covered over the device, and stress exerted on the device under the high stress thin film is induced by the high stress thin film itself, so that stress can be introduced into the channel region of the device.

Among the various methods of increasing carrier mobility by inducing a strain in the channels described above, much attention has been paid to methods 1) and 2). Method 1) includes forming several isolations, such as shallow trench isolations (STI), separating several recess patterns; filling each of the recess patterns with an epitaxial layer formed of Group IV elements having different lattice constant from that of silicon (for example, $SiGe_x$); filling an epitaxial layer of silicon on the $SiGe_x$; and reducing a height of the STI in order to expose a top surface and a sidewall of the epitaxial layer of silicon. An oxidation operation is followed to transform the Si/SiGe heterojunction interface into a thin layer of silicon oxide and a layer of silicon germanium oxide. In the case that a depth of the recess patterns is shallower than that of the STI, strained channel structure including $SiGe_x$, silicon germanium oxide, silicon oxide, and the strained silicon are all separated by STI and none of the $SiGe_x$, silicon germanium oxide, silicon oxide, and the strained silicon is considered a blanket or continuous structure on the silicon substrate.

The method described above is an isolation-first operation because the STI formation is prior to any operation related to depositing epitaxial $SiGe_x$ or Si. Depositing single crystal such as $SiGe_x$ or Si subsequently in recesses surrounded by STI generates following problems: huge loading to etch recesses between STIs; defects such as stacking faults and polycrystalline material formation at the boundaries between the single crystal and the STI; and narrow epitaxy process window because the deposition surface is distributed with recess patterns. Stacking faults induces plane defects in the single silicon crystal region and deteriorates the performance of the transistor. Polycrystalline materials formed at the boundaries between the single crystal and the amorphous STI shall be removed by additional. HCl selective etch. Critical epitaxial growth operations such as $SiGe_x$ and Si growth are carried out on a surface with several recess patterns. As a result, a more careful control of the epitaxy process is required.

Some embodiments in the present disclosure provide a transistor structure having a continuous oxide layer on the silicon substrate. The transistor structure is prepared by a method other than the isolation-first operation so that the above-mentioned problems, namely etch loading effect, defects and polycrystalline material formation, and narrow epitaxy process window are resolved.

Referring back to Method 2) of the various methods increasing carrier mobility by inducing a strain in the channels, normally a commercially acquired SOI substrate increases the production cost. Hence, some embodiments of the present disclosure provide a method of manufacturing a transistor with a strained channel starting the manufacturing from a silicon substrate instead of from an SOI substrate. An SOI structure is consequently formed during an oxidation operation in some embodiments of the present disclosure.

Definitions

In describing and claiming the present disclosure, the following terminology will be used in accordance with the definitions set forth below.

As used herein, a "lattice constant" refers to the distance between unit cells in a crystal lattice. Lattice constant is a temperature dependent parameter. In the present disclosure, the lattice constant denoted herein directs to the lattice constant at 300K. In some embodiments, silicon and germanium has a diamond crystal structure, and the corresponding lattice constants are 5.43 and 5.65 angstrom, respectively.

As used herein, a "SiGe" refers to a general term for the alloy $Si_{1-x}Ge_x$ which consists of any molar ratio of silicon and germanium. SiGe is commonly used as a semiconductor material in integrated circuits (ICs) for heterojunction bipolar transistors or as a strain-inducing layer for CMOS transistors. In some embodiments, the SiGe is short-handed as $SiGe_x$ by only indicating the molar percentage of Ge, while the molar percentage of Si in such alloy is unity less x. In some embodiments, the lattice constant of a SiGe with specific molar ratio x can be interpolated by summing up x times the Ge lattice constant and (1-x) times the Si lattice constant.

As used herein, a "critical thickness" refers to a thickness that an epitaxial layer can keep to maintain the elastic strain energy below the energy of dislocation formation. When the film thickness is below the critical thickness, the elastically strained-layer is thermodynamically stable against dislocation formation. When the film thickness is exceeding the critical thickness, dislocation starts to form and cross hatch can be observed from a surface of the film. Critical thickness is primarily composition dependent and temperature dependent. In some embodiments, the $SiGe_{0.1}$ has a critical thickness of 200 nm at 550 degrees Celsius. In other embodiments, the $SiGe_{0.08}$ has a critical thickness of 2500 nm at 500 degrees Celsius.

As used herein, a "relaxed SiGe" refers to a status of a compositionally-graded SiGe such as where the alignment of silicon and germanium atoms in the SiGe structure have relatively few threading dislocations, even when the molar percentage of the germanium gradually increases.

As used herein, a "graded film" refers to a film with continuous or intermittent composition change. In some embodiments, the grading rate is expressed in a specific thickness per specific amount of composition change. For example, 1 μm per 10% Ge change. In certain embodiments, the grading profile in the graded film includes, but not limited to, a continuous grading, a liner grading, a non-linear grading, and/or a step grading.

As used herein, "silicon-on-insulator (SOI)" refers to a kind of semiconductor structure including a top thin layer of silicon and a bottom thick layer of silicon. An insulator material such as silicon dioxide ($SiO_2$) is placed between these two layers. In some embodiments, the SOI refer to only an insulator material on a thick layer of silicon. The insulator material does not have to be silicon dioxide. In certain embodiments, the insulator material includes silicon germanium oxides.

As used herein, "vapor deposition" refers to operations of depositing materials on a substrate using a vapor phase of a material to be deposited or a precursor of the material. Vapor deposition operations include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), sputtering, thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like.

As used herein, a "mask layer" is used in the present disclosure to be an object of a patterning operation. The patterning operation includes various steps and operations and varies in accordance with features of embodiments. In some embodiments, a patterning operation patterns an existing film or layer. The patterning operation includes forming a mask on the existing film or layer and removing the unmasked portion of the film or layer with an etch or other removal operation. The mask layer or a cover layer is a photo resist or a hardmask. In some embodiments, a patterning operation directly forms a patterned layer on a surface. The patterning operation includes forming a photosensitive film on the surface, conducting a photolithography operation and a developing operation. The remaining photosensitive film may be removed or retained and integrated into the package.

As used herein, "filling" or "filled" is used in the present disclosure to describe an operation of forming material in a recess. The filling operation includes various steps and operations and varies in accordance with features of embodiments. In some embodiments, a filling operation includes forming a dielectric material in a recess. In some embodiments, a filling operation includes a vapor deposition operation.

In some embodiments, a semiconductor structure having a strained channel in a FinFET is provided. FinFET is one of the field effect transistors having a vertical fin defining the body of a transistor. Gates can be formed on one, two, or three sides of the vertical fin. When both sides of the vertical fin have a gate formed thereon, the transistor is generally referred to as a double-gate FinFET. When three sides of the vertical fin have a gate formed thereon, the transistor is generally referred to as a triple-gate FinFET. A multiple-gate FinFET helps suppress short channel effects (SCE), reduce leakage, and enhance switching behavior. Also, a multiple-gate FinFET increases gate area, which in turn improves current control without increasing gate length.

Referring to FIG. 1, a perspective view of a transistor structure, or specifically, a FinFET 100 is presented. A continuous first oxide layer 103 is on a substrate 101. A stripe 102 is positioned over the continuous first oxide layer 103. A second oxide layer 106 is disposed between the continuous first oxide layer 103 and the stripe 102. In some embodiments, the second oxide layer 106 is an oxidation layer of the stripe 102. From a device perspective, the stripe 102 and the second oxide layer 106 are combined to be a vertical fin structure 105 of the FinFET 100. The continuous first oxide layer 103 and the substrate 101 is together a silicon-on-insulator (SOI) structure 108, in which the continuous first oxide layer 103 is the insulator in the SOI structure 108.

A gate 107 is positioned over a top surface 105a and two sidewalls 105b of the stripe 102, making the FinFET 100 shown in FIG. 1 a triple-gate FinFET. The two ends of the stripe 102 includes a source region S and a drain region D, for simplicity, contacts connecting to external bias of the source region S, the drain region D, and the gate 107 are not shown in FIG. 1. A thin dielectric layer 107' is sandwiched between the gate 107 and the stripe 102. In some embodiments, the thin dielectric layer 107' has a relatively high dielectric constant (e.g. a high K dielectric, having a K greater than or equal to 3.9 and/or the K of silicon dioxide), which may be between 1 and 4 nm in thickness, formed over a portion of the top surface 105a and sidewalls 105b of the stripe 102. The high K dielectric includes, but not limited to, hafnium oxide (HfO), hafnium silicate (HfSiO$_4$), hafnium disilicate (HfSi$_4$O$_7$), zirconium oxide (ZrO), zirconium silicate (ZrSiO$_4$), tantalum oxide (Ta$_2$O$_5$). In some embodiments, the area sandwiched between the gate 107 and the stripe 102 is a channel of the FinFET 100. The majority carriers in the channel flow from source region S to drain region D when specific voltages are applied to the gate 107 and the drain region D.

An isolation 109 is disposed on the continuous first oxide layer 103 and contacting a portion of the sidewall 105b of the stripe 102. The isolation 109 possesses a shape of a long slab and is distributed on the continuous first oxide layer 103 in a parallel manner as shown in FIG. 1. Two adjacent isolation 109 are separated by a stripe 102 and the underlying second oxide layer 106, or combinatorial the fin structure 105 of the FinFET 100. In a larger scale, a plurality of the fin structure 105 is arranged in a parallel manner on the continuous first oxide layer 103, and each of the fin structures 105 is separated by an isolation 109. In some embodiments, the isolation 109 is a shallow trench isolation (STI). Various appropriate electronically insulating materials and structures sufficient for isolating adjacent fin structures 105 are within a contemplated scope of the present disclosure. Noted that instead of being separated by the isolation 109, the continuous first oxide layer 103 remains a blanket layer on the substrate 101 and supporting the bottom of the isolation 109 and the bottom of the fin structure 105.

Referring to FIG. 1, in some embodiments, the FinFET 100 is an NMOS structure. A N-type channel region is connecting to an N-type source region S and an N-type drain region D. The fin structure 105 is a N-type structure doped with at least one of phosphorous, arsenic, and antimony to form the N-type source region S and the N-type drain region D. In some embodiments, the stripe 102 includes silicon, the second oxide layer 106 includes silicon oxides, and the first oxide layer 103 includes oxides which exert a coherent two dimensional tensile stress on the fin structure 105. In some embodiments, the coherent two dimensional tensile stress is exerted on an x-y plane at a bottom surface of the stripe 102 and at a bottom surface of the second oxide layer 106. In certain embodiments, the first oxide layer 103 is silicon germanium oxides. Majority carriers in an NMOS are electrons, and the carrier mobility of electrons is increased in a tensile-strained lattice environment. In some embodiments, the carrier mobility in the channel region of the FinFET 100 having an NMOS structure is increased because the second oxide layer 106 and the first oxide layer 103 exert a coherent two dimensional tensile stress on the stripe 102, and hence the lattice in the channel region on the stripe 102 is tensile strained.

Figure 2:
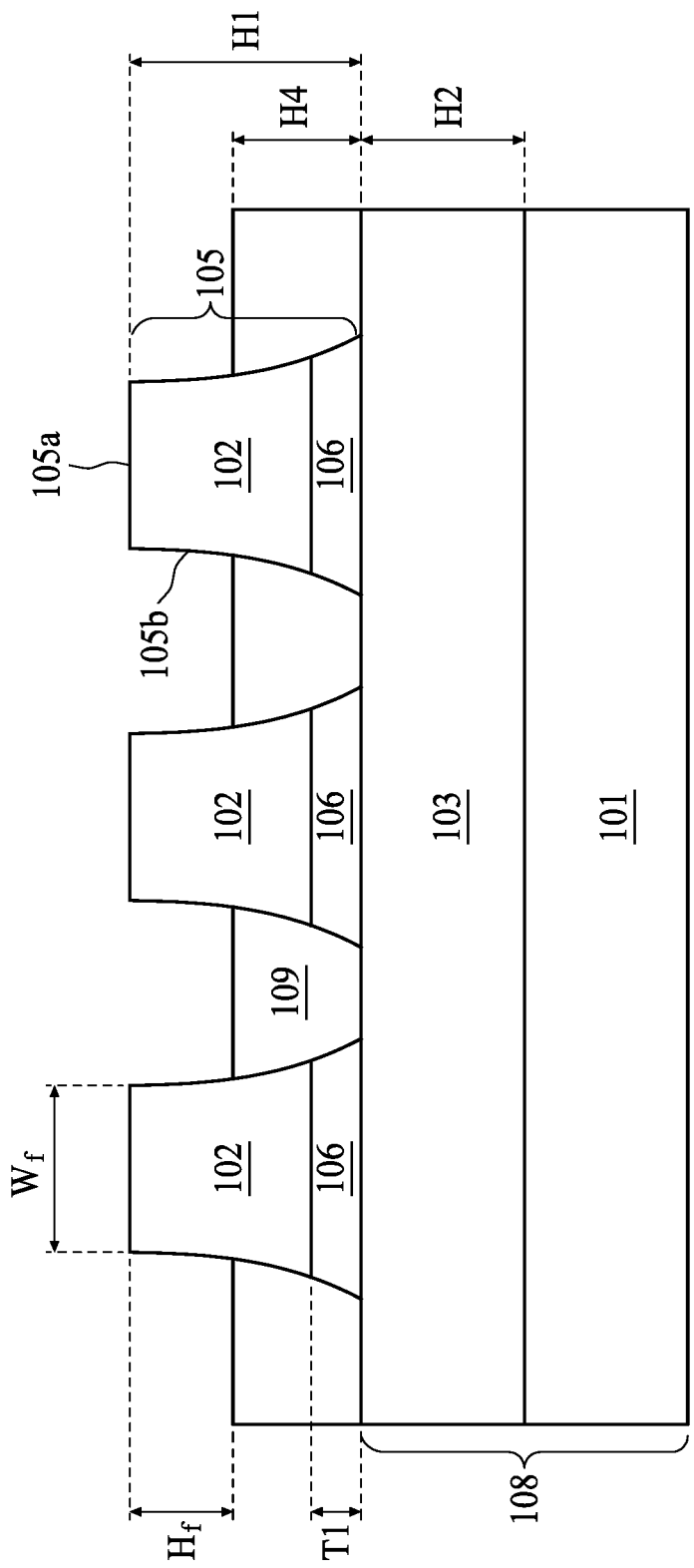
FIG. 2 is a cross sectional view of a strained channel in a FinFET structure according to some embodiments of the present disclosure.

Referring to FIG. 2, a cross sectional view of a semiconductor structure is presented. In some embodiments, FIG. 2 refers to an extended cross section sectioning along line AA' in FIG. 1. FIG. 1 shows only one fin structure 105 whereas FIG. 2 shows three fin structure 105 and the isolations 109 in between the fin structures 105. Elements with same labeling numbers as those in FIG. 1 are previously discussed with reference thereto and are not repeated here for simplicity. Referring to FIG. 1 and FIG. 2, the gate 107 and the thin dielectric layer 107' under the gate 107 is not shown in FIG. 2. In some embodiments, a thickness T1 of the second oxide layer 106 is equal to or more than about 1 nm. In other embodiments, a thickness T1 of the second oxide layer 106 is less than about 1 nm. As shown in FIG. 2, a top surface of the second oxide layer 106 is planar and flat. However, in certain embodiments, the top surface of the second oxide layer 106 is uneven with several concave and convex features. In certain embodiments, the top surface of the second oxide layer 106 is staggered. Thus, the thickness T1 of the second oxide layer 106 is a mean value with an estimation including such concave and convex features.

Referring to FIG. 2, an SOI structure 108 includes a substrate 101 and an insulator 103. In some embodiments, the substrate 101 is composed of silicon, and the insulator includes at least one of silicon oxides, silicon germanium oxides, or silicon germanium graded layer. A thickness H2 of the insulator 103 is in a range of from about 20 nm to about 50 nm. In some embodiments, the thickness H2 of the insulator 103 is greater than the thickness T1 of the second oxide layer 106. From a cross sectional view, the second oxide layer 106 is separated by the isolation 109. In FIG. 2, a top surface of the insulator 103 is planar and flat. However, in certain embodiments, the top surface of the insulator 103 is uneven with several concave and convex features. In certain embodiments, the top surface of the insulator 103 is staggered. Thus, the thickness H2 of the insulator 103 is a mean value with an estimation including such concave and convex features.

Referring to FIG. 2, the fin structure 105 includes a stripe 102 and a second oxide layer 106. A height H1 of the fin structure 105 is in a range of from about 20 nm to about 100 nm. The height H1 is calculated from the top surface 105a of the stripe 102 to a bottom surface of the second oxide layer 106. In some embodiments, the height H1 of the fin structure 105 is essentially the same as the thickness H2 of the insulator 103. As shown in FIG. 2, a sidewall 105b of the fin structure 105 is not vertical with respect to the surface of the continuous first oxide layer 103. In some embodiments, a portion toward the top surface 105a of the in structure 105 has a width smaller than a portion toward a bottom surface of the fin structure 105, and hence the fin structure 105 has a tapered cross section. In other embodiments, a portion toward the top surface 105a of the fin structure 105 has a width essentially the same as a portion toward a bottom surface of the fin structure 105, and hence the fin structure 105 has a rectangular cross section. In other embodiments, a portion toward the top surface 105a of the fin structure 105 has a width essentially the same as a portion toward a bottom surface of the fin structure 105, however, the sidewall 105b of the fin structure 105 is bulged toward the isolation 109, and thus the fin structure 105 has a barrel-shaped cross section.

A fin width $W_f$ of the fin structure 105 in FIG. 2 is defined as a dimension at a top surface 105a of the stripe 102. In some embodiments, the fin width $W_f$ of the fin structure 105 is in a range of from about 10 nm to about 200 nm. A fin height $H_f$ of the fin structure 105 in FIG. 2 is defined as a dimension from the top surface 105a of the stripe 102 to a top surface of the isolation 109. In some embodiments, the fin width $W_f$ and the fin height $H_f$ of the fin structure 105 are about the same. The fin height $H_f$ is dependent to a height H4 of the isolation 109. In some embodiments, the height H4 of the isolation 109 is one half of the fin height $H_f$. In other embodiments, the height H4 of the isolation 109 is one third of the fin height $H_f$.

Figure 3:
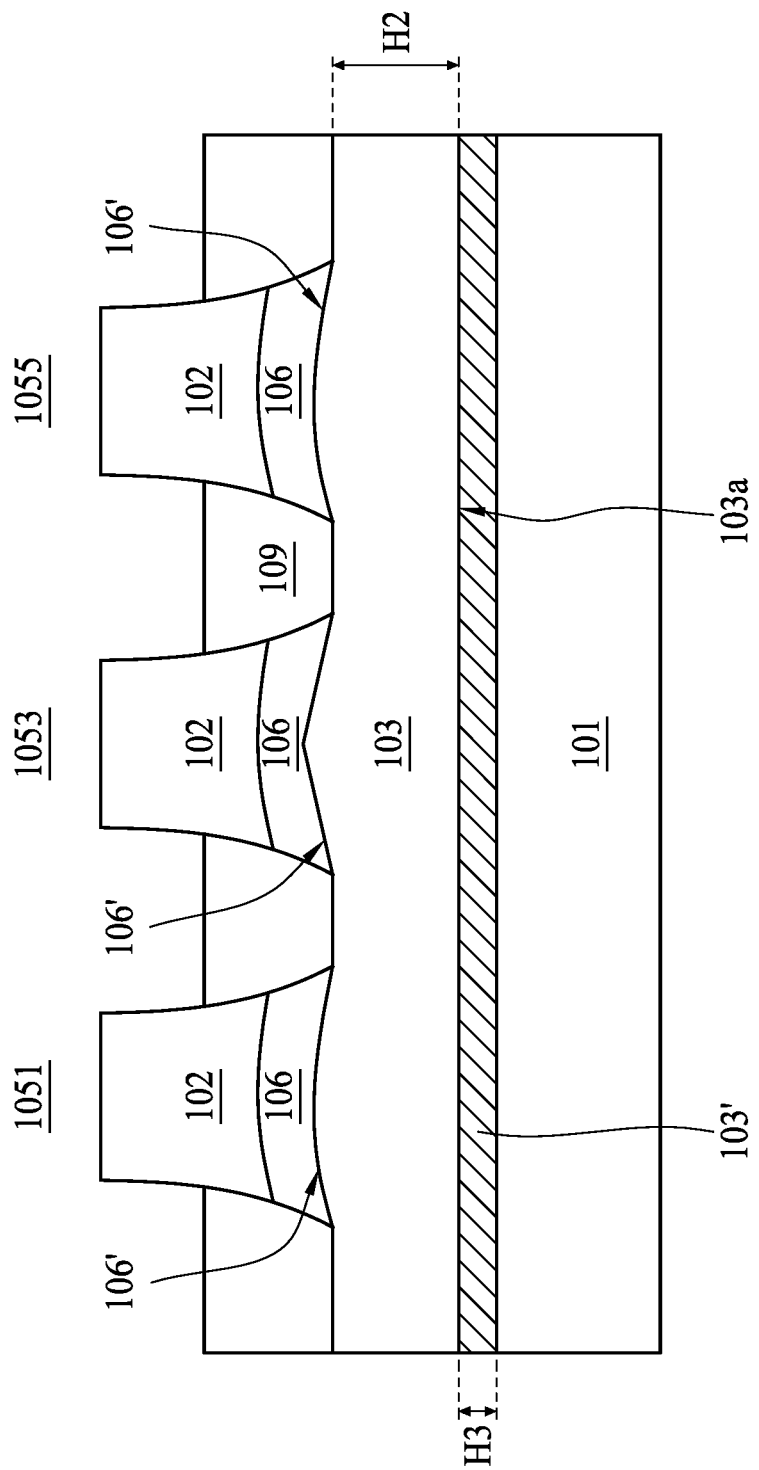
FIG. 3 is a cross sectional view of a strained channel in a FinFET structure according to some embodiments of the present disclosure.

Referring to FIG. 3, a cross sectional view of a semiconductor structure is presented. In some embodiments, FIG. 3 refers to an extended cross section sectioning along line AA' in FIG. 1. FIG. 1 shows only one fin structure 105 whereas FIG. 3 shows three fin structure 105 and the isolation 109 in between the fin structures 105. Elements with same labeling numbers as those in FIG. 1 are previously discussed with reference thereto and are not repeated here for simplicity. In FIG. 3, a layer 103' is positioned between the continuous first oxide layer 103 and the substrate 101. In some embodiments, the layer 103' is a strained layer. In other embodiments, the layer 103' is a relaxed layer. In FIG. 3, the layer 103' is a blanket and continuous layer, and an interface 103a between the continuous first oxide layer 103 and the layer 103' is not planar (not shown). In certain embodiments, the continuous first oxide layer 103 includes silicon germanium oxides, and the layer 103' includes graded silicon germanium ($SiGe_x$). The interface 103a is a boundary between the oxidized $SiGe_x$ and the un-oxidized $SiGe_x$, and hence several concave and convex features are shown at the boundary under an appropriate observation of a microscope.

In FIG. 3, a continuous first oxide layer 103 is a consequence of partial oxidation of the layer 103'. A thickness H3 of the layer 103' and a thickness H2 of the continuous first oxide layer 103 can be any ratio, but the thickness H2 of the continuous first oxide layer 103 is greater than the thickness T1 of the second oxide layer 106. In some embodiments, the thickness H2 of the continuous first oxide layer 103 is about 7 times greater than the thickness T1 of the second oxide layer 106.

In fin structure 1051 and fin structure 1055 of FIG. 3, an interface 106' between the continuous first oxide layer 103 and the second oxide layer 106 has a smooth, convex parabola shape. In some embodiments, the continuous first oxide layer 103 and the second oxide layer 106 are oxide structures transformed from a non-oxide structure, and volume expansion is expected during such transformation. A competitive result of the volume expansion between the continuous first oxide layer 103 and the second oxide layer 106 generates various interfacial conditions. For example, the interface 106' of the fin structure 1053 of FIG. 3 shows a sharp convex shape, which indicates a volume expansion of the continuous first oxide layer 103 is greater than the volume expansion of the second oxide layer 106.

Figure 4:
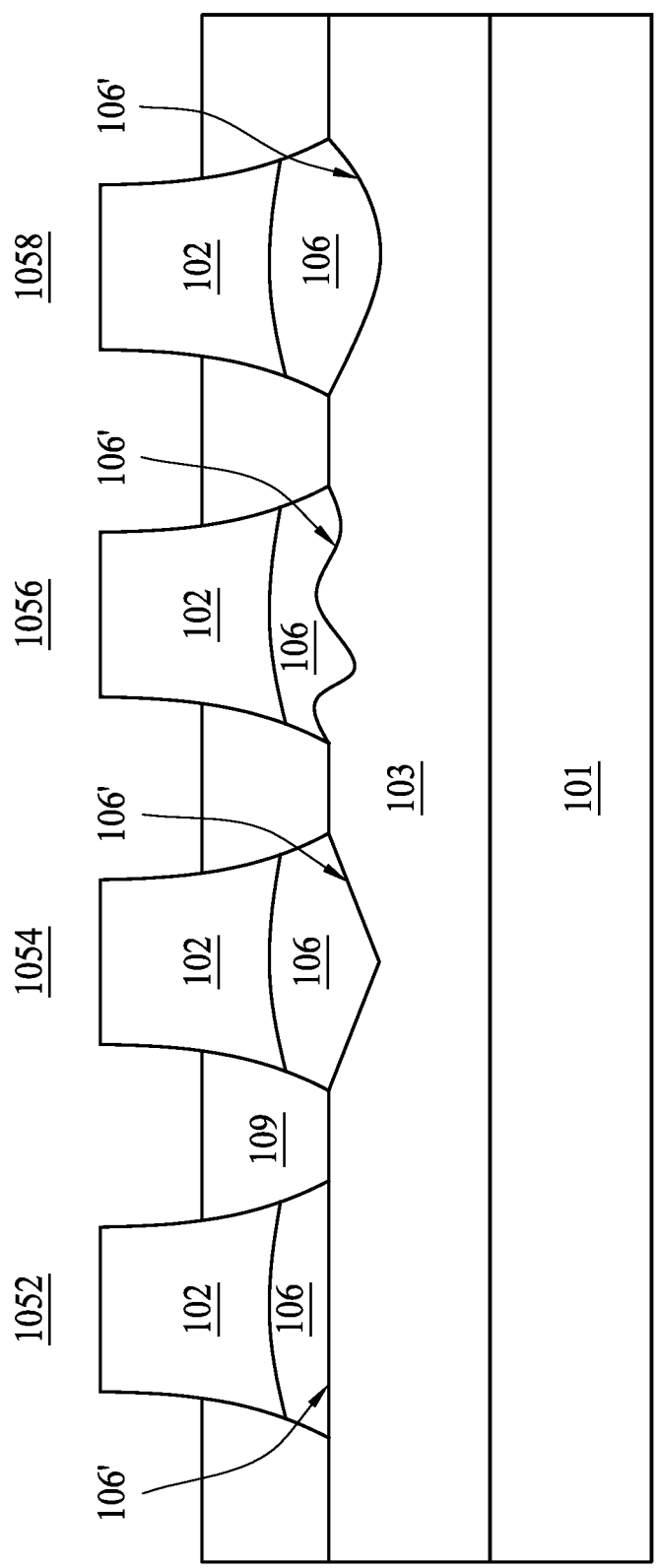
FIG. 4 is a cross sectional view of a strained channel in a FinFET structure according to some embodiments of the present disclosure.

Referring to FIG. 4, a cross sectional view of a semiconductor structure is presented. In some embodiments, FIG. 4 refers to an extended cross section sectioning along line AA' in FIG. 1. FIG. 1 shows only one fin structure 105 whereas FIG. 4 shows three tin structures 105 and the isolation 109 in between the fin structures 105. Elements with same labeling numbers as those in FIG. 3 are previously discussed with reference thereto and are not repeated here for simplicity. In FIG. 4, various interfacial conditions are presented in fin structures 1052, 1054, 1056, and 1058. Reason for generating various conditions at the interface 106' is described previously in FIG. 3 and is not repeated here. In certain embodiments, the interface 106' of the fin structure 1052 shows a line shape, that is, the interface 106' is essentially horizontal as the boundaries between the isolation 109 and the continuous first oxide layer 103. In some embodiments, the interface 106' of the fin structures 1054 and 1058 show a sharp concave shape and a smooth, concave parabola shape, both indicate a volume expansion of the second oxide layer 106 is greater than the volume expansion of the continuous first oxide layer 103. In some embodiments, the interface 106' of the fin structures 1056 shows an irregular wavy shape.

Some embodiments of the present disclosure provide a method of manufacturing a semiconductor structure, particularly a transistor having a strained channel region. In some embodiments, the transistor is a FinFET. Referring to FIG. 1, the method provided in the present disclosure is to form isolations 109 after the formation of the fin structure 105. The benefit of such method is to resolve the problems created by another method in which the isolations 109 are formed prior to the fin structure 105. The problems are previously discussed with reference thereto and are not repeated here for simplicity.

Figure 5A:
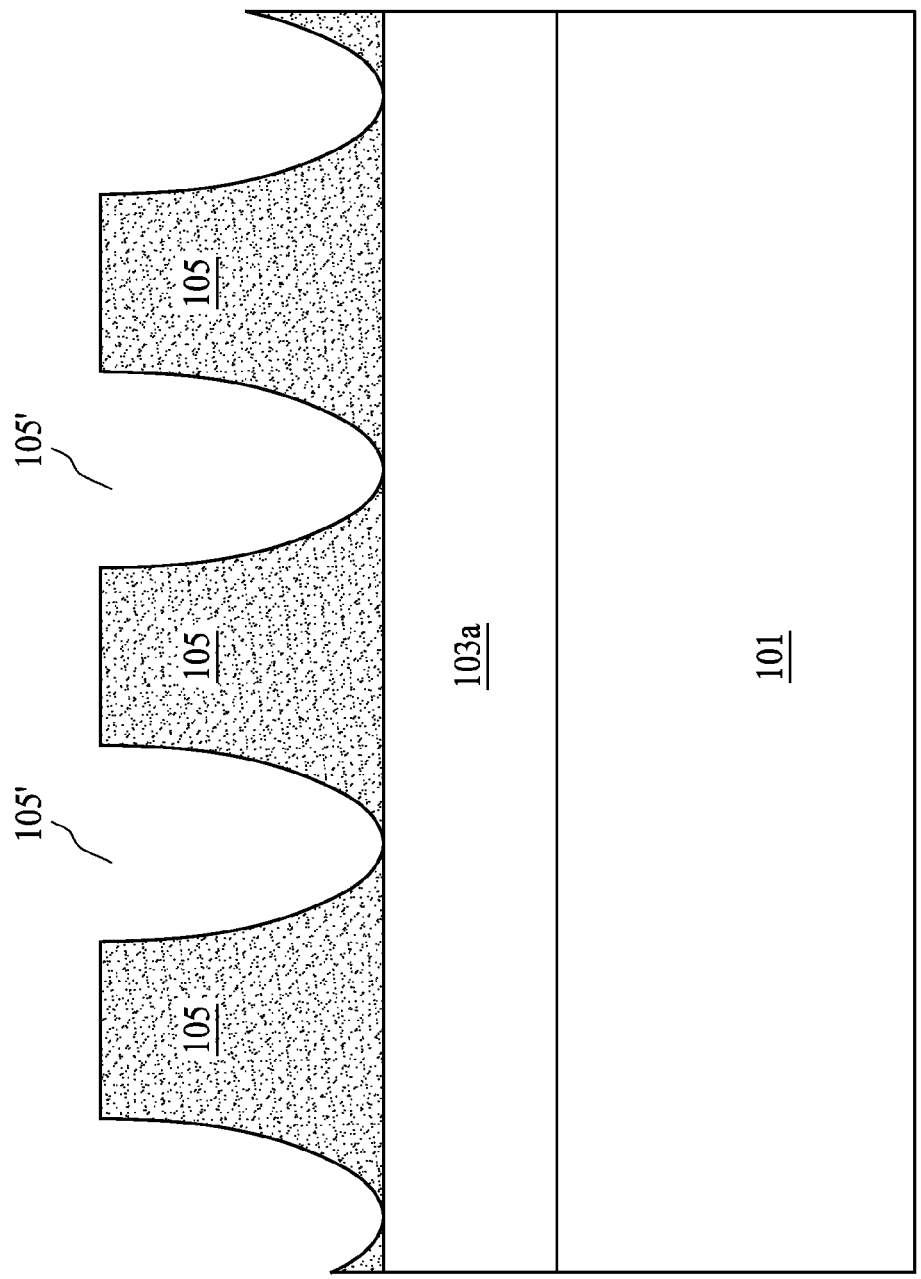
FIG. 5A to FIG. 5G are cross sectional views of a method manufacturing a strained channel in a FinFET structure according to some embodiments of the present disclosure.

Referring to FIG. 5A, a plurality of fin structure 105 is formed on a strained layer 103a. In some embodiments, the layer where a plurality of fin structure 105 land is a relaxed layer. The relaxed layer 103a shall possess a larger lattice constant than that of the fin structure 105. In some embodiments, the fin structure includes Si, and the strained layer 103a includes $SiGe_x$. For example, a strained layer 103a with a $SiGe_{0.1}$ film is deposited by a CVD operation using both silicon-based precursor and germanium-based precursor at a temperature of 550 degrees Celsius. The $SiGe_{0.1}$ film has a critical thickness of 200 nm under the temperature of 550 degrees Celsius, and hence a 150 nm thick of $SiGe_{0.1}$ film was formed using the above-mentioned CVD operation. In another example, a strained layer 103a with a $SiGe_{0.05}$ film is deposited on the substrate 101 at 500 degrees Celsius. Because the critical thickness of the $SiGe_{0.05}$ film is about 2500 nm, a thickness less than 2500 nm is chosen for the deposition operation. In still another example, a strained layer 103a with a $SiGe_{0.2}$ film is deposited on the substrate 101 at 550 degrees Celsius. Because the critical thickness of the $SiGe_{0.2}$ film is about 80 nm, a thickness less than 80 nm is chosen for the deposition operation.

In some embodiments, the silicon-based precursor includes at least one of silane dichlorosilane ($SiH_2Cl_2$), trichlorosilane ($SiHCl_3$), and silicon tetrachloride ($SiCl_4$). The germanium-based precursor includes at least one of germane ($GeH_4$) and germane diluted in hydrogen gas ($H_2$). The flow rate of the silicon-based precursor is from about 50 SCCM to about 500 SCCM, and the flow rate of the germanium-based precursor is from about 50 SCCM to about 900 SCCM.

In some embodiments, the strained layer 103a has a uniform and constant composition throughout the thickness. In other embodiments, the relaxed layer 103a has a graded composition, that is, the germanium varies from a lower content (close to the substrate 101) to higher content (close to the fin structure 105). In certain embodiments, the grading rate is about 1% germanium increase per 100 nm of the strained layer 103a. In such condition, the flow rate of the germanium-based precursor and the silicon-based precursor are adjusted accordingly along the deposition operation in order to obtain a desired grading profile. In certain embodiments, the grading profile is linear. However, in other embodiments, the grading profile is non-linear or step-like.

According to some embodiments, depositing the strained layer 103a includes flowing hydrogen chloride (HCl) with a flow rate of between 10 SCCM and 300 SCCM. For example, when sufficient amount of HCl is introduced during the formation of the relaxed layer 103a, a planarity of an upper surface of the relaxed layer 103a is improved. As such, the cross-hatch that develops during relaxed silicon germanium growth is controlled.

Referring to FIG. 5A, a silicon epitaxial layer (not shown) is subsequently deposited on the relaxed layer 103a. In some embodiments, a silicon-based precursor such as $SiCl_4$ is used in a CVD deposition operation at a temperature of about 1200 degrees Celsius. In other embodiments, silicon-based precursor including $SiH_4$, $SiH_2Cl_2$, and $SiHCl_3$ are used to grow the silicon epitaxial layer at an appropriate temperature and growth rate. A patterning operation on the silicon epitaxial layer is followed to obtain the fin structure 105 shown in FIG. 5A. Once a masking layer (not shown) has been formed and patterned on a top surface of the silicon epitaxial layer, the recesses 105' are to be formed in the silicon epitaxial layer by an etching operation. A portion of the silicon epitaxial layer that is not covered by the masking layer (not shown) is removed through a suitable process such as reactive ion etching (RIE) in order to form the recesses 105' in the silicon epitaxial layer, although other suitable processes may alternatively be used. The recesses 105' is formed to an extent that a portion of the strained layer 103a is exposed from the coverage of the silicon epitaxial layer. In some embodiments, the RIE introduces chlorine gas ($Cl_2$) and nitrogen trifluoride ($NF_3$) in Helium (He) ambient, and applies an etch bias of from about 0.1V to 100V at a temperature range of from about room temperature (~300K) to about 100 degrees Celsius.

Figure 5B:
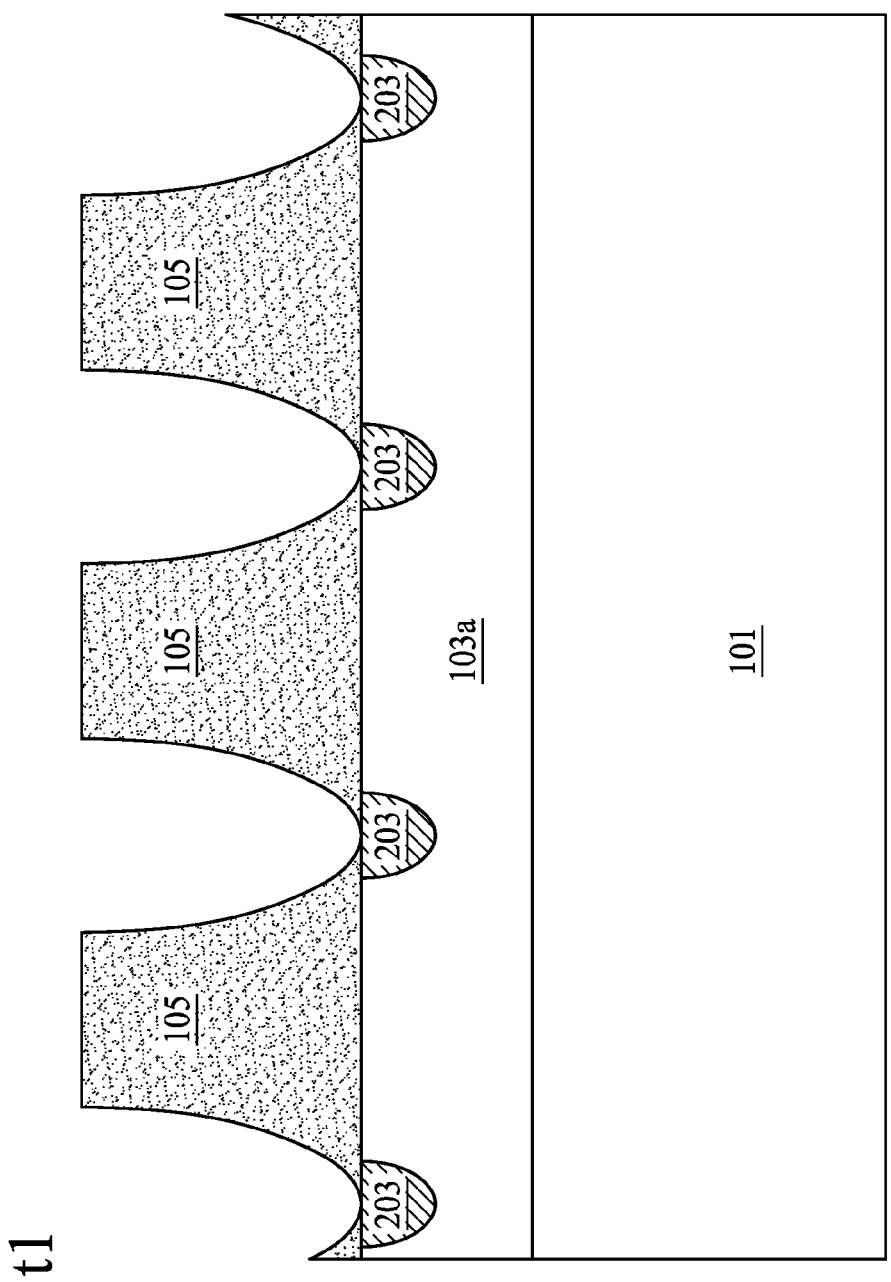

Referring to FIG. 5B, the FinFET structure is oxidized typically in the strained layer 103a. As shown in FIG. 5B, oxygen atoms react with materials situated at the exposed portion on the strained layer 103a and forms oxides 203 at those exposed portion (regions that are not covered by the fin structures 105). In some embodiments, the strained layer 103a includes silicon germanium, and the oxides 203 include silicon germanium oxides ($SiGeO_x$). The expression of the $SiGeO_x$ herein is nonstoichiometric because various bonding permutations are within the contemplated scope of the present disclosure. During the oxidation operation, the oxidation primarily occurred around the exposed portion at time t1, and laterally extended to the region under the fin structure 105 at time t2 as shown in FIG. 5C.

In some embodiments, the oxidation operation is carried out in a furnace at temperatures from about 400 to 650 degrees Celsius. The oxidation operation is sustained for about several hours. The time duration of the oxidation operation depends on the desired degree of oxidation in the strained layer 103a. In certain embodiments, the furnace is heated up to about 500 degrees Celsius with an $Ar/N_2/H_2$ ambient for 3 hours. In certain embodiments, the temperature profile during the entire oxidation operation can be varied, for example, 2 hours at 500 degrees Celsius followed by a step-like decay in the last 1 hour, in order to obtain a desired oxidation result.

Figure 5C:
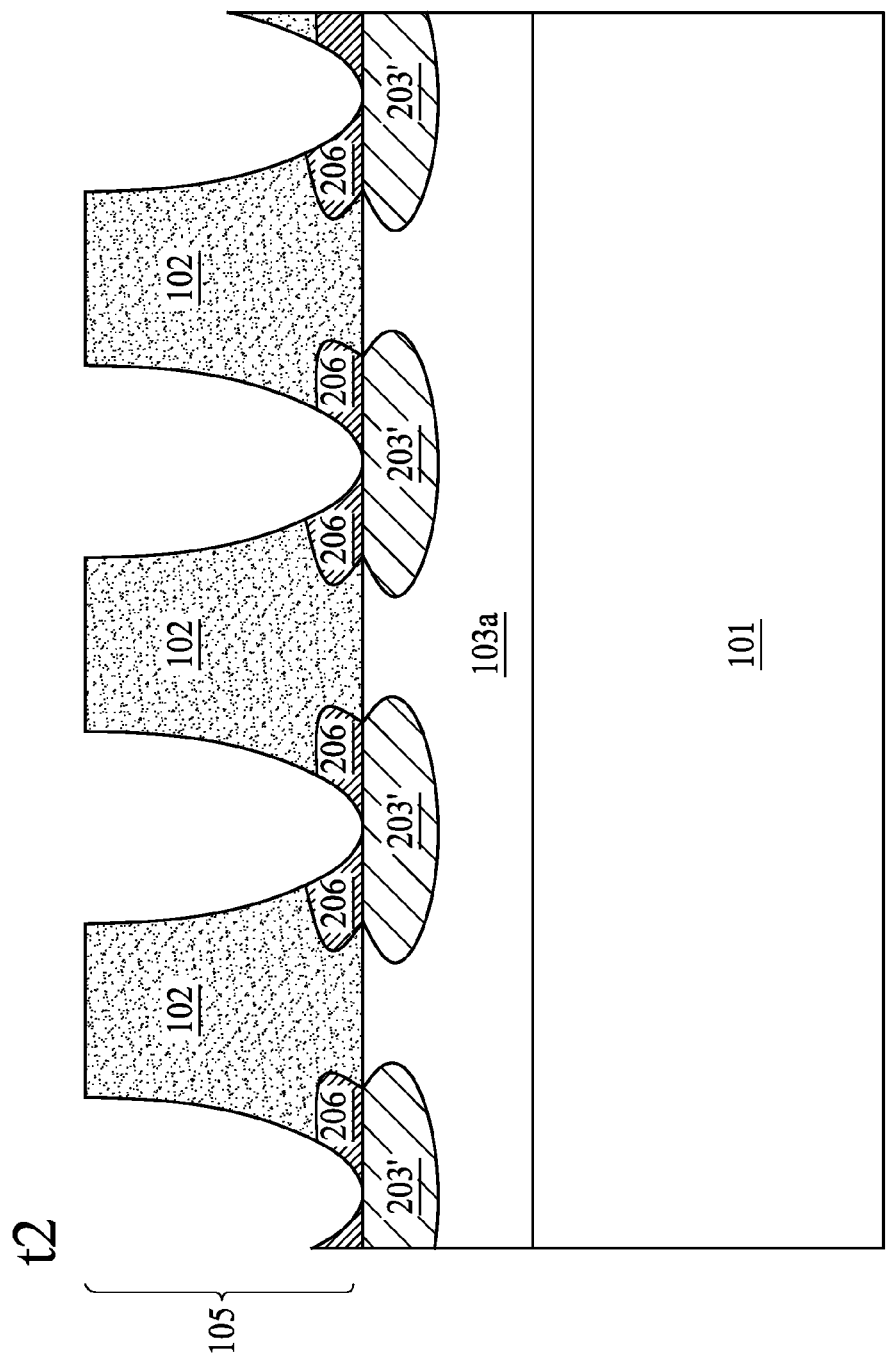

Referring to FIG. 5C, at a time t2 during the oxidation operation, an extended oxides 203' in the strained layer 103a laterally encroaches into the region under the fin structure 105. On the other hand, at time t2, oxides appear in the fin structure 105. The fin structure 105 at time t2 includes a stripe 102 which has not been oxidized, and a second oxide 206 which has been oxidized. In some embodiments, the stripe 102 includes single crystal silicon, and the second oxide 206 includes silicon oxides ($SiO_x$). The expression of the $SiO_x$ herein is nonstoichiometric because various bonding permutations are within the contemplated scope of the present disclosure. In some embodiments, the oxidation rate of the $SiGeO_x$ is about 7 to 8 times faster than the oxidation rate of the $SiO_x$. As a result, in certain embodiments, a final thickness of the $SiGeO_x$ layer is about 7 to 8 times the final thickness of the $SiO_x$ layer. At time t2, the oxidation primarily occurred around the exposed portion, both in the stripe 102 and in the strained layer 103a. The oxidation condition is previously described and is not repeated here for simplicity.

Figure 5D:
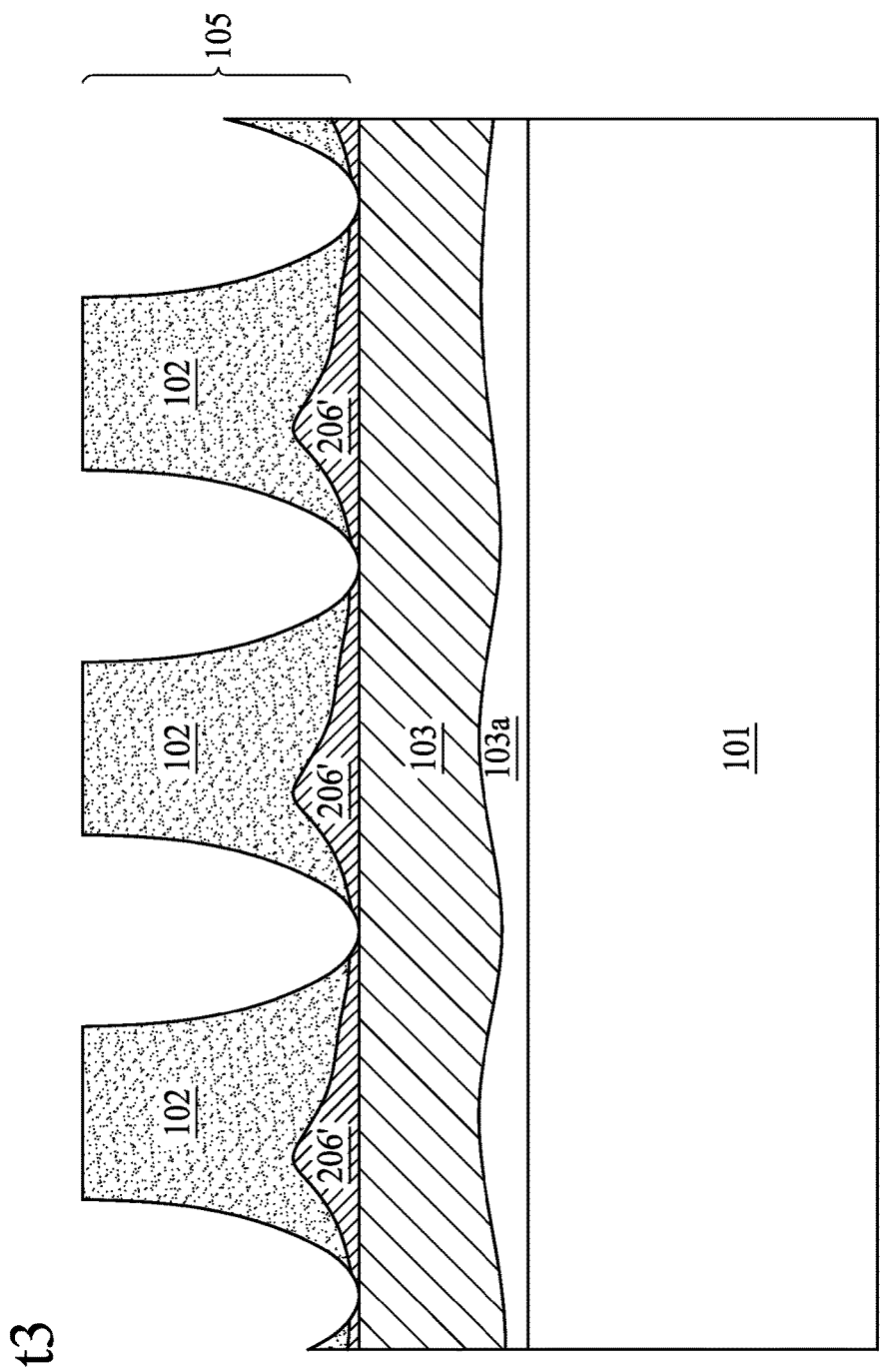

Referring to FIG. 5C and FIG. 5D, at a time t3 during the oxidation operation, a further extended oxide in the strained layer 103a joins the adjacent extended oxides 203' and forms a continuous first oxide layer 103. Comparing FIG. 5C and FIG. 5D, the second oxide 206 turns into a continuous second oxide layer 206' as shown in FIG. 5D at time t3. Note in FIG. 5D, the oxidation of the relaxed layer 103a is incomplete because a strained layer 103a with a finite thickness is positioned under the continuous first oxide layer 103. In some embodiments, the oxidation operation is stopped at time t3, and a partially oxidized relaxed layer 103a is obtained. In other embodiments, the oxidation operation is prolonged until a time t4 is reached.

Figure 5E:
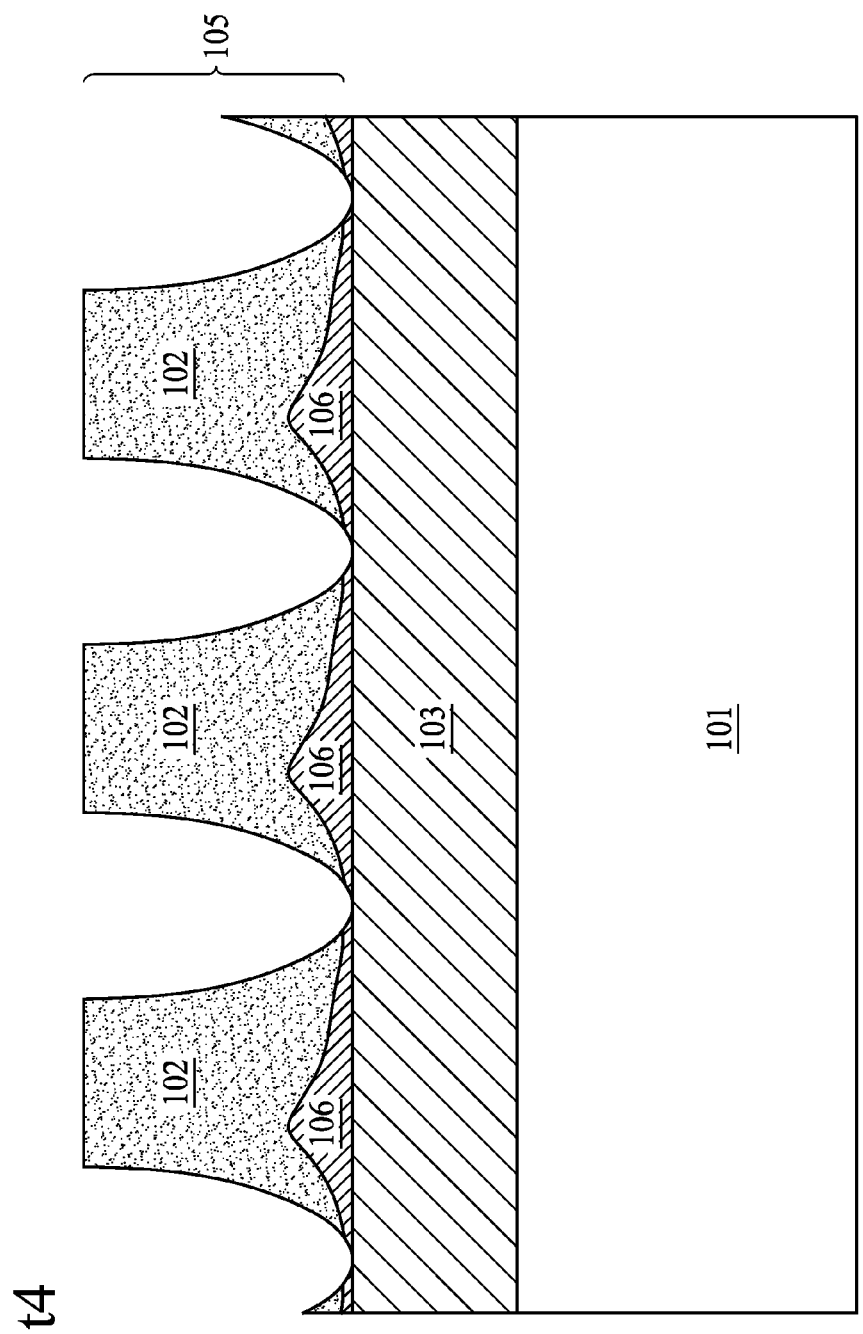

Referring to FIG. 5E, when time t4 is reached, the strained layer 103a is fully oxidized and transformed into a continuous first oxide layer 103. Comparing FIG. 5E and FIG. 5A, the continuous first oxide layer 103 in FIG. 5E has a greater volume than that of the strained layer 103a in FIG. 5A. Similarly, the volume of the fin structure 105 in FIG. 5E is greater than the volume of the fin structure 105 in FIG. 5A because the fin structure in FIG. 5E includes an un-oxidized stripe 102 and a second oxide layer 106 which possesses a slightly greater volume than the un-oxidized stripe 102. Because of the volume expansion nature of an oxidation operation, interfaces between different oxide layers have various morphologies. The interfacial morphology is discussed previously in the present disclosure with reference to FIG. 4 and FIG. 5 and is not repeated here.

Figure 5F:
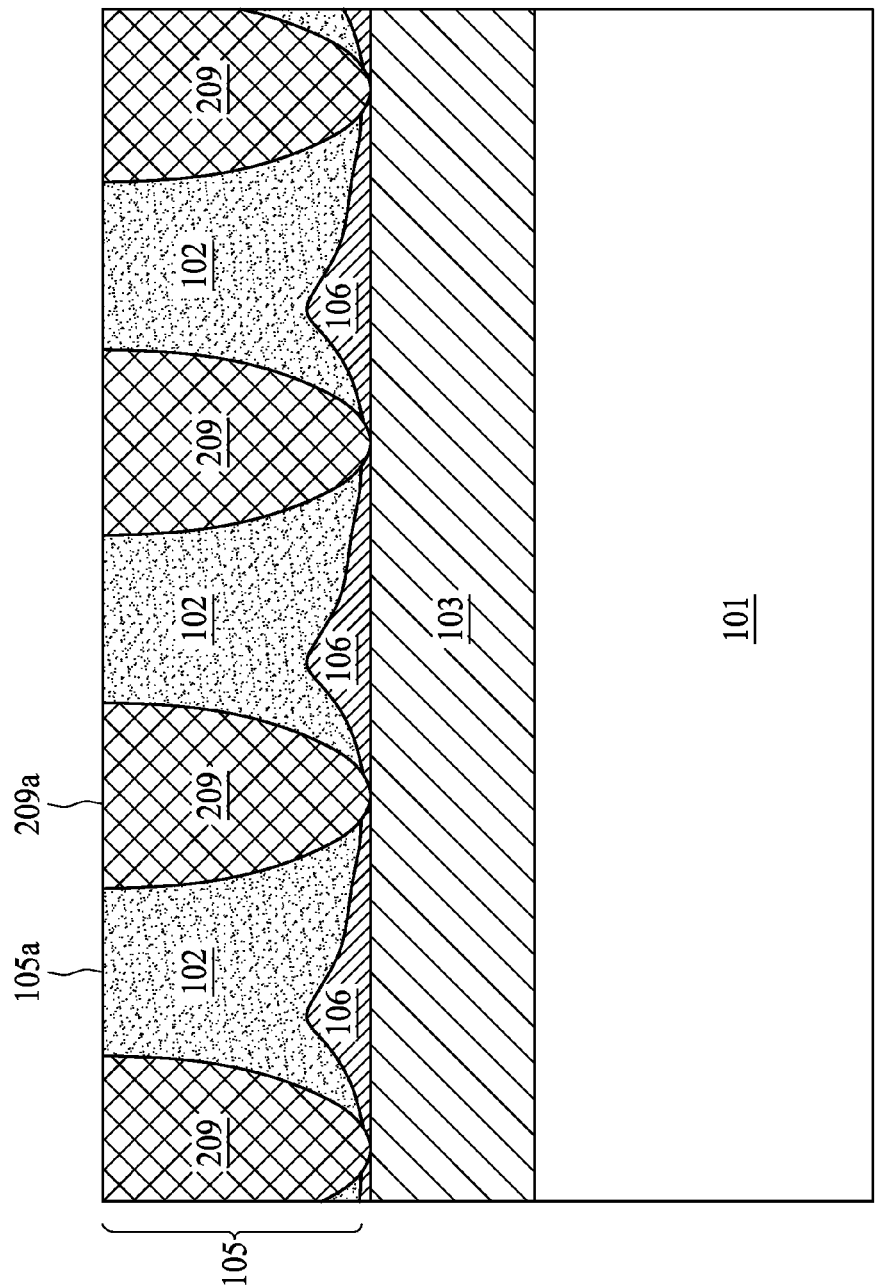

Referring to FIG. 5F, an insulating material is filed into the recesses between the fin structure 105 to form an isolation 209. In some embodiments, the insulating material is deposited by a CVD operation. For example, silicon-based precursor such as $SiH_4$ and oxygen are used in a CVD operation at a temperature of about 300 to 500 degrees Celsius to form silicon oxides. In some embodiments, silicon-based precursor such as tetraethylorthosilicate (TEOS) and oxygen or ozone are used in a PECVD operation at a temperature of from about 300 to about 450 degrees Celsius to form silicon oxides. In other embodiments, the silicon-based precursor such as $SiH_4$ and oxygen, together with dopants such as phosphine ($PH_3$) and diborane ($B_2H_6$) are used in a CVD operation at a temperature of about 300 to 500 degrees Celsius to form boronphosphorous silicon glass (BPSG).

In some embodiments, after the insulating material is formed, a chemical mechanical polishing (CMP) operation is conducted to planarize a top surface of the isolation 209. As shown in FIG. 5F, after the CMP operation, the top surface 209a of the isolation 209 is coplanar with the top surface 105a of the fin structure 105. In other words, the top surface 105a of the fin structure 105 is exposed from the as-deposited insulating material film (not shown).

Figure 5G:
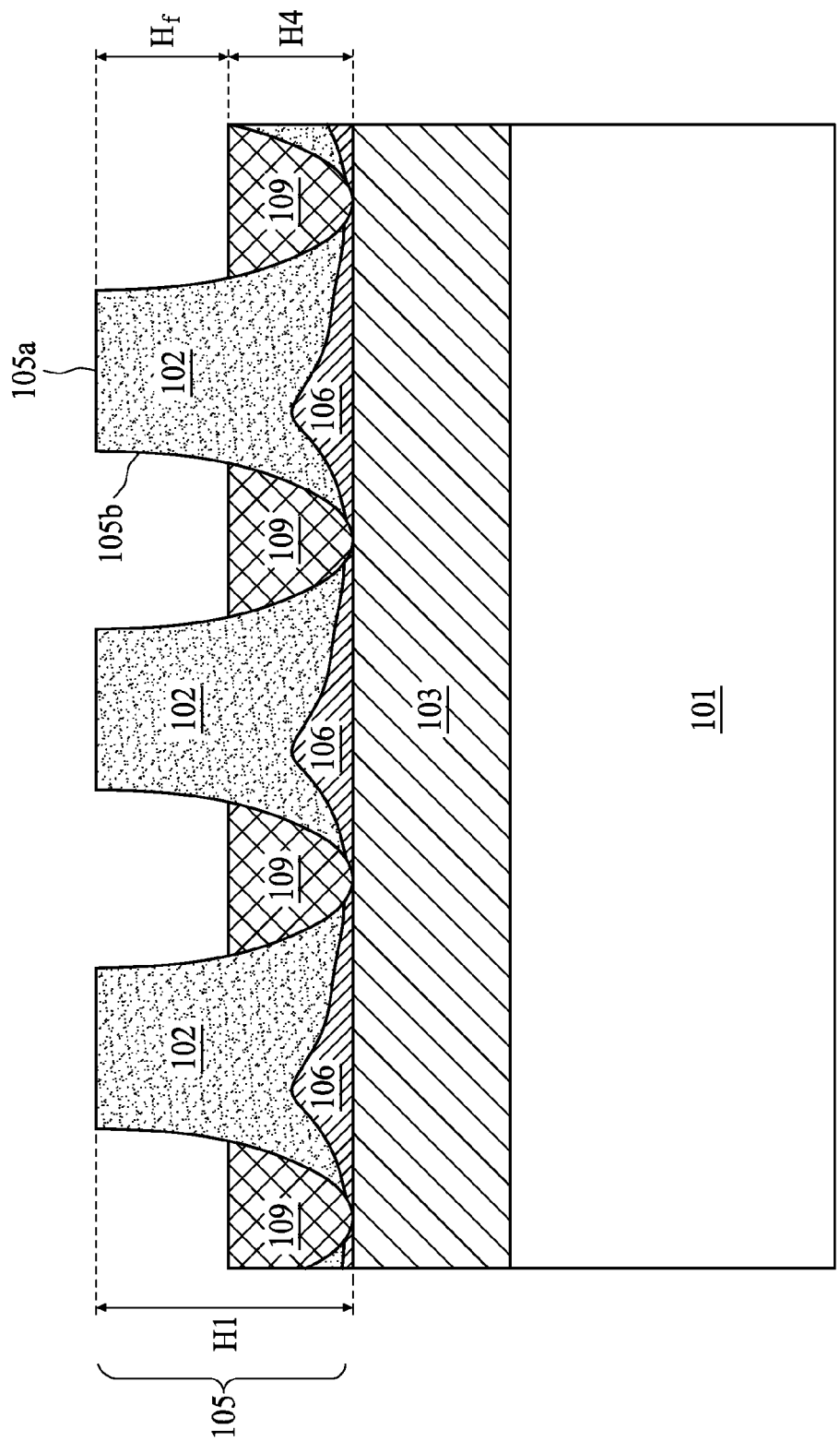

Referring to FIG. 5G, an etching operation is conducted to remove a portion of the isolation 209 shown in FIG. 5F. The etching operation is to further expose a portion of the sidewall 105b, in addition to the top surface 105a, of the fin structure 105. In some embodiments, the etching operation is a CERTAS® etch, which introduces hydrogen fluoride (HF) and ammonia ($NH_3$) as etchants to the insulating material. In certain embodiments, the CERTAS® etch is performed at a temperature of between about 20 degrees Celsius and about 60 degrees Celsius, such as about 30 degrees Celsius, while the pressure is held between about 10 mTorr and about 100 mTorr, such as about 20 mTorr. In some embodiments, the duration of the CERTAS® etch is hold several tens of seconds depending on the desired amount of insulating materials being removed. Additionally, the flow rate of HF may be between about 10 SCCM and about 100 SCCM, such as about 20 SCCM, and the flow rate of NH3 may be between about 10 SCCM and about 100 SCCM, such as about 20 SCCM. Other diluents, such as argon, xenon, helium, or other nonreactive gases, may additionally be utilized.

Referring to FIG. 5F and FIG. 5G, after the etching operation, the isolation 209 in FIG. 5F between adjacent fin structures 105 is thinned to a height H4 that is lower than the height H1 of the fin structure 105, and exposing a portion of the sidewall 105b of the fin structure 105. In some embodiments, the exposed portion of the sidewall 105b has a height $H_f$ representing the fin height.

The present disclosure provides a transistor. The transistor includes a substrate, a continuous first oxide layer on the substrate, a plurality of stripes overlaid on the continuous first oxide layer, a gate on a sidewall and a top surface of one of the plurality of stripes, a second oxide layer between each of the plurality of stripes and the continuous first oxide layer, and an isolation disposed on the continuous first oxide layer, contacting a portion of the sidewall of one of the plurality of stripes.

The present disclosure provides a FinFET. The FinFET includes a silicon-on-insulator (SOI) with an insulator; a plurality of fin structures on the insulator; an isolation on the insulator, and between two adjacent fin structures in the plurality of fin structures; and an oxide layer between each of the plurality of fin structures and the insulator, wherein the insulator comprises silicon germanium oxide.

The present disclosure provides a method of manufacturing a FinFET. The method includes forming a plurality of fin structures on a layer (strain layer is workable) having a larger lattice constant than that of the fin structure by a patterning operation; oxidizing the fin structure and the layer (strain layer is workable) to transform the layer (strain layer is workable) into a first oxide layer; filling insulating material between adjacent fin structures; and etching the insulating material to expose a top surface and at least a portion of a sidewall of the fin structure.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a FINFET, comprising:
   forming a plurality of fin structures on a layer having a larger lattice constant than that of the fin structure by a patterning operation;
   oxidizing the fin structure and the layer to transform the layer into a first oxide layer;
   filling insulating material between adjacent fin structures after oxidizing the fin structure and the layer; and
   etching the insulating material to expose a top surface and at least a portion of a sidewall of the fin structure.

2. The method of manufacturing a FINFET in claim 1, wherein the oxidizing the fin structure and the layer to transform the layer into a first oxide layer transforms at least a portion of the fin structures into a second oxide layer.

3. The method of manufacturing a FINFET in claim 2, wherein the second oxide layer comprises silicon oxide.

4. The method of manufacturing a FINFET in claim 1, wherein the forming a plurality of fin structures on a layer having a larger lattice constant than that of the fin structure by a patterning operation comprises:
depositing a silicon layer on the layer;
patterning the silicon layer into the plurality of fin structures; and
exposing a portion of the layer from a coverage of the silicon layer.

5. The method of manufacturing a FINFET in claim 1, wherein the oxidizing the fin structure and the layer to transform the layer into a first oxide layer comprises a thermal oxidation having a temperature of from about 400 to about 650 degrees Celsius.

6. The method of manufacturing a FINFET in claim 3, wherein the oxidizing the fin structure and the relaxed layer to transform the layer into a first oxide layer comprises a thermal oxide growth having a time duration of from about 1 to about 5 hours.

7. The method of manufacturing a FINFET in claim 1, further comprising a chemical mechanical polishing operation after the filling insulating material between adjacent fin structures to form isolations to expose the top surface of the fin structure.

8. The method of manufacturing a FINFET in claim 1, wherein the first oxide layer comprises silicon germanium oxide.

9. A method of manufacturing a FINFET, comprising:
forming a silicon germanium layer over a silicon substrate;
forming a silicon stripe over the silicon germanium layer, a portion of the silicon germanium layer being exposed from the silicon stripe;
oxidizing the silicon germanium layer and the silicon stripe thereby transforming the portion of the silicon germanium layer being exposed from the silicon stripe into silicon germanium oxide and transforming a bottom portion of the silicon stripe in contact with the silicon germanium layer into silicon oxide across the bottom portion of the silicon stripe; and
disposing insulating material over the silicon germanium oxide after oxidizing the silicon germanium layer.

10. The method of manufacturing a FINFET in claim 9, further comprising:
continuing oxidizing the oxidizing the silicon germanium layer thereby transforming a portion of the silicon germanium layer not being exposed from the silicon stripe into silicon germanium oxide.

11. The method of manufacturing a FINFET in claim 9, wherein the forming a silicon stripe over the silicon germanium layer comprises:
epitaxially growing silicon over the silicon germanium layer; and
patterning the silicon to form the silicon stripe.

12. The method of manufacturing a FINFET in claim 9, wherein the forming the silicon germanium layer over the silicon substrate comprises:
grading the germanium composition in the silicon germanium layer.

13. The method of manufacturing a FINFET in claim 9, wherein the oxidizing the silicon germanium layer comprises a furnace operation.

14. The method of manufacturing a FINFET in claim 9, further comprising etching the insulating material to expose a top surface and at least a portion of a sidewall of the silicon stripe.

15. A method of manufacturing a FINFET, comprising:
forming a first layer having a first oxidizing rate over a silicon substrate;
forming a second layer having a second oxidizing rate over the first layer, wherein the first oxidizing rate is greater than the second oxidizing rate;
oxidizing the first layer and the second layer, thereby transforming a bottom portion of the second layer in contact with the first layer into a second oxide layer across the bottom portion of the second layer.

16. The method of manufacturing a FINFET in claim 15, wherein the first oxidizing rate is greater than 5 times of the second oxidizing rate.

17. The method of manufacturing a FINFET in claim 15, wherein the second layer comprises a plurality of parallel stripes, a portion of the first layer being exposed from two adjacent parallel stripes.

18. The method of manufacturing a FINFET in claim 17, further comprising etching the insulating material to expose a top surface and at least a portion of a sidewall of the second layer.

19. The method of manufacturing a FINFET in claim 15, wherein the oxidizing the first layer and the second layer transform the first layer into a first continuous oxide layer.

20. The method of manufacturing a FINFET in claim 15, further comprising disposing insulating material over the first layer after oxidation.

* * * * *